United States Patent [19]

Frerking

[11] Patent Number: 4,906,944
[45] Date of Patent: Mar. 6, 1990

[54] INTEGRATOR CONTROLLED TIME COMPENSATED CLOCK OSCILLATOR

[75] Inventor: Marvin E. Frerking, Cedar Rapids, Iowa

[73] Assignee: Rockwell International Corporation, El Segundo, Calif.

[21] Appl. No.: 233,694

[22] Filed: Aug. 17, 1988

[51] Int. Cl.$^4$ .................. H01L 1/02; H01L 7/00; H01L 7/06; H01L 7/08

[52] U.S. Cl. ........................ 331/1 A; 331/17; 331/25; 331/176

[58] Field of Search ............ 331/1 A, 17, 18, 25, 331/176

[56] References Cited

U.S. PATENT DOCUMENTS

| | | | |
|---|---|---|---|
| 3,713,033 | 1/1973 | Frerking | 331/116 |
| 3,989,931 | 11/1976 | Phillips | 235/92 |
| 4,297,657 | 10/1981 | Frerking | 331/176 |
| 4,305,041 | 12/1981 | Frerking | 328/155 |
| 4,348,772 | 9/1982 | Leland et al. | 455/260 |
| 4,513,259 | 4/1985 | Frerking | 331/176 |
| 4,611,181 | 9/1986 | Fukumura et al. | 331/66 |
| 4,633,422 | 12/1986 | Brauer | 364/571 |
| 4,772,852 | 9/1988 | Viti | 331/1 A X |

Primary Examiner—David Mis
Attorney, Agent, or Firm—John C. McFarren; M. Lee Murrah; H. Fredrick Hamann

[57] ABSTRACT

A time compensated clock oscillator (TCCO) is provided with an integrator to produce stability of the output frequency. The integrator is connected between the D/A converter and the voltage controlled crystal oscillator (VCXO) of the TCCO. The output frequency of the VCXO is fed back to a frequency counter, which samples the output, determines its average frequency, and compares it with a reference frequency. A microprocessor corrects the reference frequency for temperature changes, determines the output frequency error, calculates the output frequency drift rate, and provides a digital correction signal. The D/A converter converts the digital correction signal to an input voltage for the integrator. The integrator produces a ramp-shaped control voltage for input to the VCXO. Because the control voltage produced by the integrator changes smoothly over the interval between samples by the frequency counter, the output frequency drift rate of the VCXO is continuously corrected to produce improved short-term frequency stability.

12 Claims, 1 Drawing Sheet

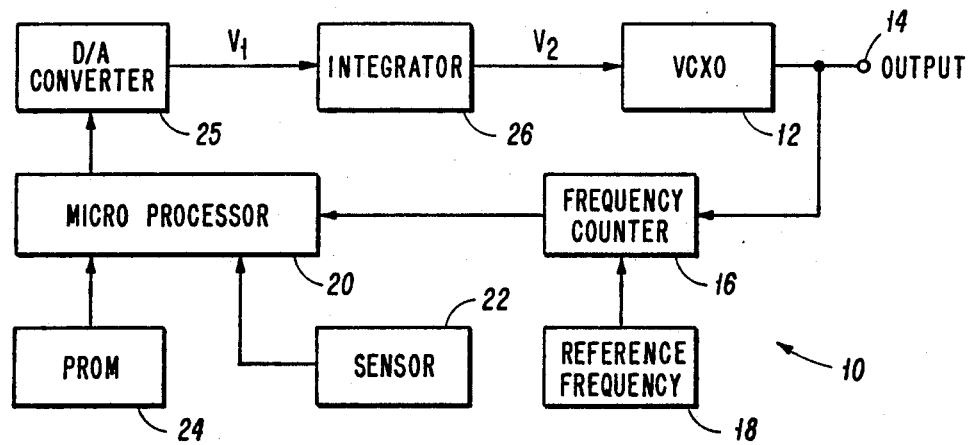
FIG 1
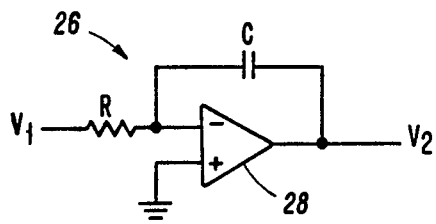
FIG 2
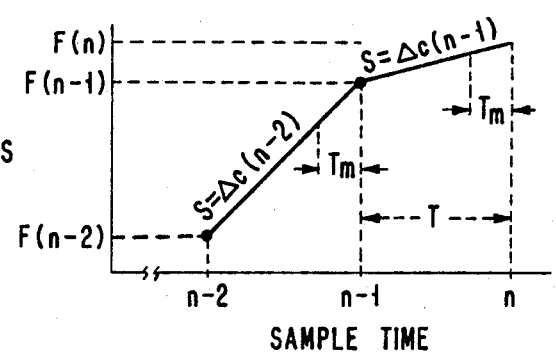
FIG 4
FIG 3
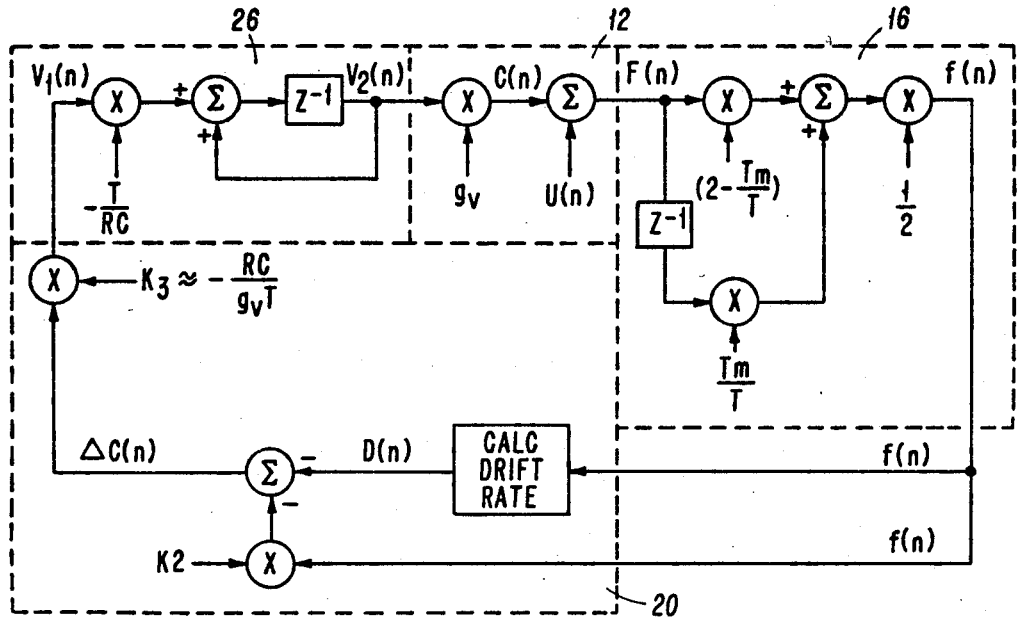

INTEGRATOR CONTROLLED TIME COMPENSATED CLOCK OSCILLATOR

TECHNICAL FIELD

The present invention relates to electrical oscillators and, in particular, to an integrator controlled, time compensated clock oscillator that continuously compensates for output frequency error and drift rate of a voltage controlled crystal oscillator to provide a stable output frequency.

BACKGROUND OF THE INVENTION

Temperature compensated oscillators are well known in the art as described in U.S. Pat. Nos. 3,713,033; 4,297,657; 4,305,041; and 4,513,259; which are incorporated herein by reference. However, poor short-term stability has been a problem for the entire class of externally compensated crystal oscillators, of which the time compensated clock oscillator (TCCO) is a member.

In a basic TCCO, the frequency of a voltage controlled crystal oscillator (VCXO) is sampled at one to ten second intervals by a frequency counter. The frequency counter uses a reference frequency from a reference oscillator as its time base. A temperature correction programmable read only memory (PROM) stores reference frequency errors as a function of temperature. A microprocessor may receive inputs from a temperature sensor, the temperature correction PROM, the reference oscillator, and the frequency counter to correct the output frequency for frequency errors and drift rate of the VCXO. The output frequency of the VCXO is corrected by a digital-to-analog (D/A) converter that provides a control voltage to the control input of the VCXO. However, short-term instability remains because the corrections are made only at specific sample times, which causes the VCXO to provide a sawtooth-shaped frequency change with respect to time. This occurs because the VCXO drifts without a control voltage change until the next sample time, at which time a new control voltage is provided.

Because prior TCCOs have short-term instability, there is a need for an improved TCCO for applications requiring precise carrier frequency control. An improved TCCO should provide a control voltage to the VCXO to provide continuous compensation for the frequency drift of the VCXO.

SUMMARY OF THE INVENTION

The present invention comprises a time compensated clock oscillator (TCCO) that includes an analog integrator connected between a D/A converter and a voltage controlled crystal oscillator (VCXO). The output signal of the VCXO is fed back to a frequency counter where it is compared with a reference frequency. The frequency counter provides an input to a microprocessor, which also receives inputs from a temperature sensor and a temperature correction PROM. The output of the microprocessor is provided to the D/A converter for input to the integrator. From the data it receives, the microprocessor computes the output frequency error and drift rate of the VCXO and provides a correction voltage so that the output of the integrator produces the necessary control voltage to the VCXO. Because the integrator output changes smoothly over the interval between samples of the VCXO output frequency, the output frequency drift of the VCXO is corrected continuously, resulting in a stable output frequency.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which:

FIG. 1 is a block diagram of an integrator controlled, time compensated clock oscillator of the present invention;

FIG. 2 is a schematic diagram of the integrator of the present invention;

FIG. 3 is a functional block diagram of the feedback loop of the integrator controlled TCCO of the present invention; and FIG. 4 is a graph illustrating instantaneous frequency versus sample time of the present invention.

DESCRIPTION OF THE PREFERRED EMBODIMENT

An integrator controlled, time compensated clock oscillator (TCCO) of the present invention is illustrated in the block diagram of FIG. 1. TCCO 10 includes a voltage controlled crystal oscillator (VCXO) 12 that provides an output frequency at terminal 14. The output frequency of VCXO 12 is fed back to a frequency counter 16. Frequency counter 16 also receives a reference frequency 18 from a reference crystal oscillator. Frequency counter 16 compares the reference frequency 18 with the output frequency of VCXO 12 and provides an input signal to a microprocessor 20. Microprocessor 20 also receives inputs from a temperature sensor 22 and a temperature correction PROM 24. Microprocessor 20 calculates the frequency error and drift rate of VCXO 12 by correcting reference frequency 18 for temperature changes, determining the difference between the present output frequency and the previous frequency, and subtracting frequency changes attributable to the previous correction voltage. Microprocessor 20 provides a digital output to D/A converter 25, which provides an input voltage $V_1$ to integrator 26. Integrator 26 provides a control voltage $V_2$ that changes continuously throughout the interval between frequency sample times to provide continuous correction for the frequency drift in VCXO 12. Thus, microprocessor 20 and D/A converter 25 provide adjustments to input voltage $V_1$ so that control voltage $V_2$ output by integrator 26 changes continuously at a rate equal to but opposite in direction from the frequency drift of VCXO 12.

Integrator 26 may comprise the circuit elements illustrated in the schematic diagram of FIG. 2. The input voltage $V_1$ is applied to a resistor R connected to an inverting terminal of an operational amplifier 28. A non-inverting input of operational amplifier 28 is connected to ground. A capacitor C is connected in parallel with operational amplifier 28. The components of integrator 26 are selected so that the input voltage $V_1$ is integrated to form a ramp-shaped control voltage $V_2$ that compensates for the frequency drift rate of VCXO 12.

FIG. 3 is a functional block diagram of the feedback loop of TCCO 10 comprising VCXO 12, frequency counter 16, microprocessor 20, and integrator 26. In FIG. 3, the representation of integrator 26 is shown in the upper left where RC is the time constant of the actual analog integrator and T is the sample time of the digital system. In the representation of VCXO 12, the constant $g_v$ is the sensitivity of VCXO 12, and C(n) is the actual frequency correction applied to VCXO 12. The quantity U(n) represents the frequency perturbation corrupting the output of VCXO 12, primarily as a result of temperature changes. The representation of frequency counter 16 is shown in the upper right where F(n) represents the instantaneous output frequency at time sample n, and f(n) represents the average value of the output frequency determined by frequency counter 16. Frequency f(n) is the average frequency for the time interval leading up to the time of instantaneous frequency F(n). $T_m$ is the averaging time of frequency counter 16, which may be less than the full sample time T. The blocks labelled $Z^{-1}$ each represent a time delay of one sample time T.

During operation, VCXO 12 outputs instantaneous frequency F(n) that includes the frequency error and drift rate represented by perturbation U(n). During the sample time T, frequency counter 16 calculates the average frequency f(n) during the averaging time $T_m$. The average frequency f(n) is input to microprocessor 20 which calculates a drift rate D(n). Calculation of the drift rate D(n) requires removal of the effect of the continuously varying control voltage on the VCXO. Because the frequency counter 16 measures the average frequency f(n) during the measurement interval $T_m$, the effect of the integrator induced change must be properly scaled.

FIG. 4 illustrates the effect of the control voltage on the instantaneous frequency of VCXO 12. A correction factor $\Delta C$ that represents the slope of the integrator output is applied to the integrator input. The drift rate of VCXO 12 over the time interval n−1 to n, exclusive of the control induced changes, is given by:

$$D(n)=F(n)-F(n-1)-\Delta C(n-1).$$

However, frequency counter 16 measures the average frequency f(n) rather than the instantaneous frequency F(n). Referring to FIG. 4, the average frequency at time n is given by:

$$f(n)=F(n)-(T_m/2T)\Delta C(n-1).$$

Therefore, the instantaneous frequency at time n is given by:

$$F(n)=f(n)+(T_m/2T)\Delta C(n-1).$$

Likewise, the instantaneous frequency at n−1 is given by:

$$F(n-1)=f(n-1)+(T_m/2T)\Delta C(n-2).$$

Substituting these expressions, the drift rate can be expressed as:

$$D(n)=f(n)-f(n-1)-[(1-T_m/2T)\Delta C(n-1)+(T_m/2T)\Delta C(n-2)].$$

It is not sufficient merely to apply the drift rate D(n) to integrator 26 because this would not drive any existing error to zero. Therefore, as shown in FIG. 3, another factor $K_2 f(n)$ is added to the drift rate D(n) to form the correction factor $\Delta C(n)$. The correction factor $\Delta C(n)$ is then scaled by another factor $K_3$, which is approximately $-RC/g_v T$, to normalize the gain of the correction voltage $V_1(n)$ input to integrator 26. Correction voltage $V_1(n)$ applied to integrator 26 is scaled by factor $-T/RC$ and integrated to produce control voltage $V_2(n)$ which is input to VCXO 12. The sensitivity constant $g_v$ of VCXO 12 is applied to control voltage $V_2(n)$ to produce the actual frequency correction C(n) that compensates for perturbation factor U(n).

Although the present invention has been described with respect to a specific embodiment thereof, various changes and modifications may be suggested to one skilled in the art. In particular, the method of the present invention is applicable to systems for controlling a variable output in which the output is sampled, compared with a reference value, and analyzed to produce a correction factor, and wherein the correction factor is integrated to provide a ramped control input that continuously compensates for variations in the output. Thus, it is intended that the present invention encompass such changes and modifications to the described embodiment as fall within the scope of the appended claims.

I claim:

1. A controlled oscillator, comprising:
   means for generating an output frequency;
   means for sampling said output frequency;
   means for analyzing said sampled output frequency to produce a correction voltage; and
   means for integrating said correction voltage to provide a control signal to said generating means to correct for drift of said output frequency.

2. The controlled oscillator of claim 1, wherein said means for generating an output frequency comprises a voltage controlled crystal oscillator.

3. The controlled oscillator of claim 1, wherein said sampling means comprises a frequency counter that receives said output frequency as part of a feedback control loop.

4. The controlled oscillator of claim 1, wherein said analyzing means comprises a microprocessor that receives inputs from a temperature sensor, a temperature correction memory, and said sampling means.

5. The controlled oscillator of claim 1, wherein said sampling means receives a reference frequency for comparison with said output frequency.

6. The controlled oscillator of claim 1, wherein said control signal provided by said integrating means is a ramp-shaped signal that provides stability of said output frequency.

7. A time compensated clock oscillator, comprising:
   a voltage controlled oscillator for generating an output frequency;
   a frequency counter for sampling said output frequency and comparing said sampled frequency with a reference frequency;
   a microprocessor for receiving inputs from a temperature sensor, a temperature correction memory, and said frequency counter;
   said microprocessor analyzing said inputs and generating a correction voltage; and
   an integrator for receiving said correction voltage and providing a control voltage to said voltage controlled oscillator to correct for drift of said output frequency.

8. The time compensated clock oscillator of claim 7, wherein said microprocessor calculates a frequency error and drift rate of said output frequency and generates said correction voltage to compensate for said frequency error and drift rate.

9. The time compensated clock oscillator of claim 8, wherein said control voltage is a ramp-shaped signal that provides stability of said output frequency.

10. A method of controlling a variable output frequency, comprising the steps of:
    generating the output frequency;
    sampling the output frequency;
    comparing said sampled frequency with a reference frequency;
    analyzing said sampled and compared frequency to produce a correction factor;
    integrating said correction factor to provide a ramped control input; and
    providing said ramped control input to compensate for variations of the output frequency.

11. The metehod of claim 10, further comprising the step of providing a voltage controlled crystal oscillator (VCXO) for generating the output frequency, said VCXO being subject to a frequency error and drift rate.

12. The method of claim 11, wherein analyzing said sampled and compared frequency produces a correction voltage and integrating said correction voltage provides a ramped control voltage that compensates for said frequency error and drift rate of said VCXO.

* * * * *